United States Patent
Hsieh

(10) Patent No.: US 11,374,034 B2
(45) Date of Patent: Jun. 28, 2022

(54) DISPLAY PANEL AND METHOD FOR MANUFACTURING THE SAME

(71) Applicant: AU Optronics Corporation, Hsin-Chu (TW)

(72) Inventor: Meng-Ting Hsieh, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 126 days.

(21) Appl. No.: 16/737,961

(22) Filed: Jan. 9, 2020

(65) Prior Publication Data

US 2020/0395384 A1    Dec. 17, 2020

(30) Foreign Application Priority Data

Jun. 13, 2019   (TW) ................................ 108120539

(51) Int. Cl.
*G02F 1/13*       (2006.01)
*H01L 27/12*      (2006.01)
*G02F 1/1362*     (2006.01)
*G02F 1/1368*     (2006.01)

(52) U.S. Cl.
CPC ........ *H01L 27/124* (2013.01); *H01L 27/1259* (2013.01); *G02F 1/1368* (2013.01); *G02F 1/136286* (2013.01)

(58) Field of Classification Search
CPC ....................................................... G02F 1/13
See application file for complete search history.

(56) References Cited

U.S. PATENT DOCUMENTS

| | | | |
|---|---|---|---|
| 2008/0231583 A1* | 9/2008 | Chen ................. | G02F 1/136259 345/98 |
| 2012/0147311 A1* | 6/2012 | Chen ................. | G02F 1/136259 349/139 |
| 2017/0102578 A1* | 4/2017 | Shin ................. | G02F 1/136209 |
| 2019/0227400 A1* | 7/2019 | Lee ..................... | G02F 1/13458 |

FOREIGN PATENT DOCUMENTS

| | | |
|---|---|---|
| CN | 1797528 A | 7/2006 |
| CN | 107102493 A | 8/2017 |
| CN | 108172599 A | 6/2018 |

* cited by examiner

*Primary Examiner* — Sang V Nguyen
(74) *Attorney, Agent, or Firm* — McClure, Qualey & Rodack, LLP

(57) ABSTRACT

A display panel includes a pixel array, a plurality of first wirings, a plurality of second wirings, a conductive line and an insulation layer. The pixel array includes a plurality of first pixels and a plurality of second pixels. The first wirings are electrically connected to the first pixels, respectively. The second wirings are electrically connected to the second pixels, respectively. The conductive line extends to partially overlap the second wirings and is electrically connected to the second wirings, in which the conductive line is configured to provide a same-color signal to the second pixels. The insulation layer is disposed between the first wirings and the conductive line.

5 Claims, 9 Drawing Sheets

US 11,374,034 B2

DISPLAY PANEL AND METHOD FOR MANUFACTURING THE SAME

CROSS-REFERENCE TO RELATED APPLICATION

This application claims priority to Taiwan Application Serial Number 108120539, filed Jun. 13, 2019, which is herein incorporated by reference in its entirety.

BACKGROUND

Technical Field

The present disclosure relates to a display panel and a method for manufacturing the same.

Description of Related Art

Among various electronic products of home appliance devices, the display panels applied with thin film transistors (TFTs) have been widely used. The thin film transistor type display panel is mainly composed of a thin film transistor array substrate, a color filter array substrate and a display medium, in which the thin film transistor array includes a plurality of thin film transistors and a pixel electrode which is arranged corresponding to each of the thin film transistors. In addition, electrical signals can be transmitted from the driving circuit to the thin film transistor array to drive the thin film transistors, thereby controlling the corresponding pixel electrodes.

During manufacturing the display panel, the positions of forming the aforementioned components are first arranged according to the size of the display panel, and the masks are generated corresponding to the positions of the formation. However, when the size of the display panel varies, the originally-generated mask may be unable to be used correspondingly on the display panel with varied size. If the display panel with the original size is directly cut, there is a risk that the display panel cannot be used normally because the wirings are cut off. Accordingly, how to improve this issue has become one of the important research and development topics in related fields.

SUMMARY

One embodiment of the present disclosure is to provide a display panel, which includes a pixel array, a plurality of first wirings, a plurality of second wirings, a conductive line and an insulation layer. The pixel array includes a plurality of first pixels and a plurality of second pixels. The first wirings are electrically connected to the first pixels, respectively. The second wirings are electrically connected to the second pixels, respectively. The conductive line extends to partially overlap the second wirings and is electrically connected to the second wirings, in which the conductive line is configured to provide a same-color signal to the second pixels. The insulation layer is disposed between the first wirings and the conductive line.

In some embodiment, the display panel further includes a substrate. The pixel array is disposed on the substrate, and the minimum vertical distance from the first pixels to an edge of the substrate is greater than the minimum vertical distance from the second pixels to the edge of the substrate.

In some embodiment, a portion of the second pixels are arranged in a last column of the pixel array, and the minimum vertical distance from the portion of the second pixels to the edge of the substrate is greater than 0 micron and less than or equal to 150 microns.

In some embodiment, the display panel further includes a substrate. The pixel array is disposed on the substrate, each of the second wirings has an end surface, and the end surfaces of the second wirings are aligned with the same edge line of the substrate.

In some embodiment, the pixel array further includes a plurality of third pixels, the second pixels are located between the first pixels and the third pixels, and the area of each of the third pixels is smaller than the area of each of the first pixels and the second pixels.

In some embodiment, the line width of the conductive line is greater than the line width of each of the first wirings.

In some embodiment, the display panel further includes a gate driving array circuit. The gate driving array circuit is electrically connected to the conductive line.

In some embodiment, the display panel further includes a plurality of source driving components, and one of the source driving components which is the farthest from the second pixels is electrically connected to the conductive line.

In some embodiment, the conductive line has a plurality of protrusions, each of the protrusions protrudes toward the second wirings and is connected to the second wirings, wherein the insulation layer surrounds the protrusions.

One embodiment of the present disclosure is to provide a method for manufacturing a display panel including the following steps. An original panel structure is cut along a cutting plane to obtain a display panel, wherein the cutting plane is separated from a plurality of first wirings of the display panel and is overlapped with a substrate and a plurality of second wirings of the display panel, such that an edge line of the substrate is aligned with an end surface of each of the second wirings. A conductive line is welded to the second wirings.

In some embodiment, the method for manufacturing the display panel further includes the following steps. Before cutting the original panel structure, the conductive line is formed, and the conductive line is extended to overlap the first wirings and the second wirings. Before cutting the original panel structure, an insulation layer is formed to electrically insulate the conductive line from the first wirings and the second wirings.

With the aforementioned configuration, if the situation of that the second wirings are cut due to the cutting requirement is occurred, the same-color signal can be transmitted through the conductive line which is welded to the second wirings, so that the same-color signal is transmitted to the second pixels electrically connected with the second wirings through the second wirings, thereby controlling the second pixels display the same color.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other words, in some embodiments of the present invention, these practical details are not necessary. Moreover, some well-known structures and devices are schematically depicted in order to simplify the drawings.

In the present disclosure, it is comprehensible that terms such as first, second, and third are used to describe various components or areas. The terms are used for identifying single component or area. Therefore, the following first component or area may also be called as the second component or area without departing from the intention of the present disclosure. "Approximately" or "substantially" used herein includes an average value within an acceptable deviation range and the described value. For example, "approximately" or "substantially" may represent being within one or more standard deviations of the described value, or within ±30%, ±20%, ±10%, or ±5%.

The display panel of the present disclosure can be obtained after cutting the original panel structure. In this regard, when the requirement for the panel size is to be smaller than the size of the existing panel structure, the original panel structure can be manufactured first, and then the original panel structure is cut to obtain a display panel conforming to the size requirement in the subsequent process. In this way, cost savings can be achieved since it is unnecessary to manufacture additional masks while facing the size requirement. In addition, since the display panel is obtained by cutting the original panel structure, the size of the manufactured display panel is more flexible, too.

Figure 1A:
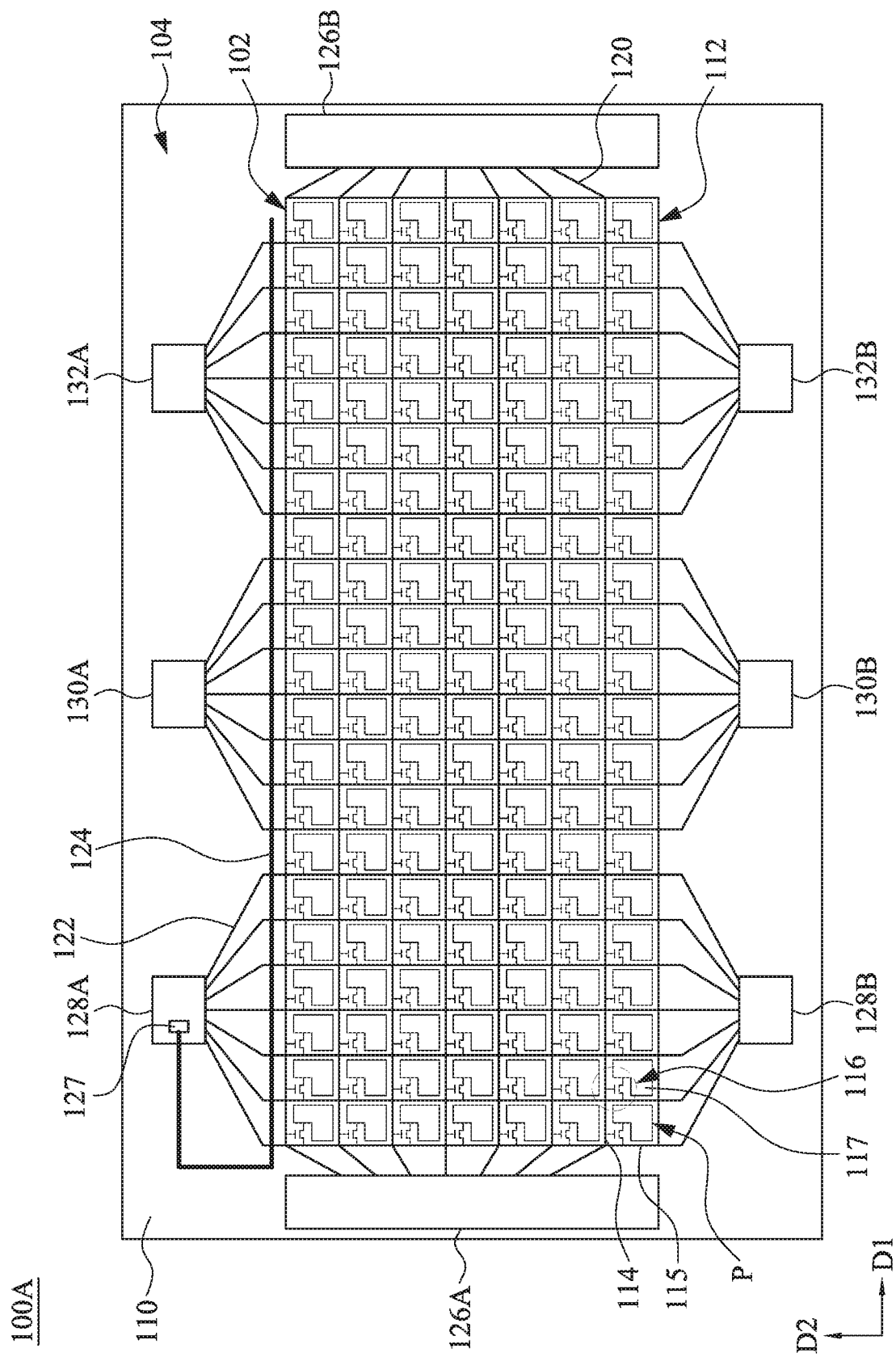
FIG. 1A is a top schematic view illustrating an original panel structure according to a first embodiment of the present disclosure.

Reference is made to FIG. 1A first. FIG. 1A is a top schematic view illustrating an original panel structure 100A according to a first embodiment of the present disclosure. In order to facilitate the description, FIG. 1A illustrates a first direction D1 and a second direction D2, wherein the first direction D1 is different from the second direction D2. For example, the first direction D1 and the second direction D2 may be orthogonal to each other, and may be a lateral direction and a longitudinal direction in FIG. 1A, respectively.

The original panel structure 100A has a display area 102 and a peripheral area 104, wherein the peripheral area 104 is located outside the display area 102. The original panel structure 100A can provide an image through the display area 102, while the peripheral area 104 can be viewed as a bezel of the original panel structure 100A, which can be, for example, an area in which the drive components or wirings are placed.

The original panel structure 100A includes a first substrate 110, a pixel array 112, a gate wiring 120, wirings 122, conductive line 124, source driving components 128A, 128B, 130A, 130B, 132A, 132B and gate driving array circuits 126A, 126B. The pixel array 112, the gate wiring 120, the wiring 122, the conductive line 124, the source driving components 128A-132B, and the gate driving array circuits 126A, 126B may be disposed on the first substrate 110, wherein the first substrate 110 may be a transparent substrate such as a glass substrate.

The pixel array 112 is located in the display area 102 and may include scan lines 114, data lines 115, thin film transistors 116, and pixel electrodes 117. The scan lines 114 can extend in the first direction D1 and be arranged along the second direction D2. The data lines 115 can extend in the second direction D2 and be arranged along the first direction D1. The scan lines 114 and the data lines 115 can intersect with each other to form a plurality of pixel regions P in the display area 102. The thin film transistors 116 are respectively disposed in the pixel regions P, and the respective gates and sources of the thin film transistors 116 are respectively connected to the corresponding scan lines 114 and data lines 115. The pixel electrodes 117 are respectively disposed in the pixel regions P and are connected to the drains of the corresponding thin film transistors 116. The material of the pixel electrode 117 includes a transparent conductive material such as indium tin oxide, indium zinc oxide, zinc oxide, carbon nanotubes, indium gallium zinc oxide or other suitable materials. With this configuration, the thin film transistor 116 and the pixel electrode 117 in each pixel region P can form a single pixel, and thus the pixel array 112 can be regarded as an array in which a plurality of pixels are arranged. In the present embodiment, the pixel array 112 in which a plurality of pixels are arranged is illustrated as 7 rows by 21 columns, but the present disclosure is not limited thereto.

Gate driving array circuits 126A, 126B and source driving components 128A-132B may be disposed outside of the pixel array 112. In specific, the gate driving array circuits 126A, 126B and source driving components 128A-132B can be located outside of display area 102 and within the peripheral area 104. The gate driving array circuits 126A, 126B and the source driving components 128A-132B can be configured to control the thin film transistors 116 of the pixels of the pixel array 112 by inputting electrical signals, so as to drive the corresponding pixel electrodes 117.

The gate wirings 120 are located outside of the display area 102 and located within the peripheral area 104, and electrically connects the gate driving array circuits 126A, 126B to the scan lines 114, such that the electrical signals outputted from the gate driving array circuits 126A, 126B can be transmitted through the scan lines 114 to the gates of the corresponding thin film transistors 116. The wirings 122 are located outside of the display area 102 and located within the peripheral area 104. In some embodiments, the wirings 122 can be arranged as fan-out wirings. The wiring 122 can electrically connect the source driving components 128A-132B to the data lines 115, so that the electrical signals outputted from the source driving components 128A-132B can be transmitted through the data lines 115 to the sources of the corresponding thin film transistors 116.

According to the aforementioned connection manner, the pixels of the pixel array 112 can be divided into three groups, wherein the pixels in the 1$^{st}$ column to the 7$^{th}$ column and the 1$^{st}$ row to the 7$^{th}$ row are the first group, the pixels in the 8$^{th}$ column to the 14$^{th}$ column and the 1$^{st}$ row to the 7$^{th}$ row are the second group, and the pixels in the 15$^{th}$ column to the 21$^{st}$ column and the 1$^{st}$ row to the 7$^{th}$ row are the third group. Different groups of pixels can be electrically connected to different source driving components 128A-132B through the data lines 115 and the wirings 122. Specifically, the pixels of the first group can be electrically connected to the source driving components 128A, 128B through the data lines 115 and the wirings 122, the pixels of the second group can be electrically connected to the source driving components 130A, 130B through the data lines 115 and the wirings 122, and the third group of pixels can be electrically connected to the source driving components 132A, 132B through the data lines 115 and the wirings 122.

The conductive line 124 may be disposed outside of the pixel array 112, that is, they can be located outside of the display area 102 and within the peripheral area 104. The conductive line 124 can extend to partially overlap the wirings 122. "the conductive line can partially overlap the wirings" herein may mean that the conductive line 124 and the wirings 122 have at least an overlapping relationship, such that there are overlapping regions between the conductive line 124 and the wirings 122 while looking down the original panel structure 100A.

The original panel structure 100A may further include an insulation layer (not shown), and the insulation layer is located between the conductive line 124 and the wirings 122 to electrically insulate them. In the present embodiment, the conductive line 124 may be located below the wirings 122, that is, the conductive line 124 may be closer to the first substrate 110 than the wirings 122, and the process for the conductive line 124 may be compatible with the processes for other layers. For example, when the thin film transistor 116 of the pixel array 112 is a bottom-gate type thin film transistor, the conductive line 124 can be formed in conjunction with the gate of the bottom-gate type thin film transistor by patterning the same metal layer, and the aforementioned insulation layer for electrically isolating the conductive line 124 and the wirings 122 may include a gate insulation layer. In some embodiments, "same metal layer" herein may includes a metal material, an alloy, a metal oxide or a stacked structure formed by a combination thereof, and the insulation layer may includes an organic or inorganic material such as silicon oxide or silicon nitride, silicon oxynitride, a combination thereof or other suitable dielectric materials. The present disclosure is not limited thereto. In other embodiments, the conductive line 124 may be located above the wirings 122, that is, the wirings 122 may be closer to the first substrate 110 than the conductive line 124, and similarly, the conductive line 124 can be formed by the compatible processes for other layers.

One end of the conductive line 124 can be extended to the source driving component 128A, that is, one end of the conductive line 124 can extend to one of the source driving component 128A-132B which is closest to the edge of the original panel structure 100A, and is electrically connected to this source driving component (i.e., the source driving component 128A). In some embodiments, the source driving component 128A can include the same-color signal driving circuit 127, wherein the same-color signal driving circuit 127 is electrically connected to the conductive line 124 and configured to output the electrical signal to the conductive line 124. The other end of the conductive line 124 can be extended such that the conductive line 124 is sufficiently overlapped with all wirings 122 which are located on one side of the pixel array 112 (e.g., the upper side of the pixel array 112), and thus the conductive line 124 can cross all wirings 122 which are located on one side of the pixel array 112. In addition, the other end of the conductive line 124 may be arranged to no electrically connect to the electrical component.

The conductive line 124 can be used in conjunction with subsequent processes. For example, a cutting process is performed on the original panel structure 100A subsequently. If the wirings 122 are cut, the electrical connections between a portion of the pixels of the pixel array 112 and the corresponding source driving components 128A-132B are cut off, which will cause this portion of the pixels to be unable to input the electrical signals through the wirings 122 and the display content thereof is unable of be controlled. At this time, the conductive line 124 can be processed so that the conductive line 124 can be electrically connected to this portion of the pixel through the remaining wirings 122, and the electrical signals outputted from the same-color signal driving circuit 127 can be transmitted to this portion of the pixels, thereby avoiding a situation in which the display quality is lowered due to the inability to control the pixels. The mechanism for this will be described later.

Figure 1B:
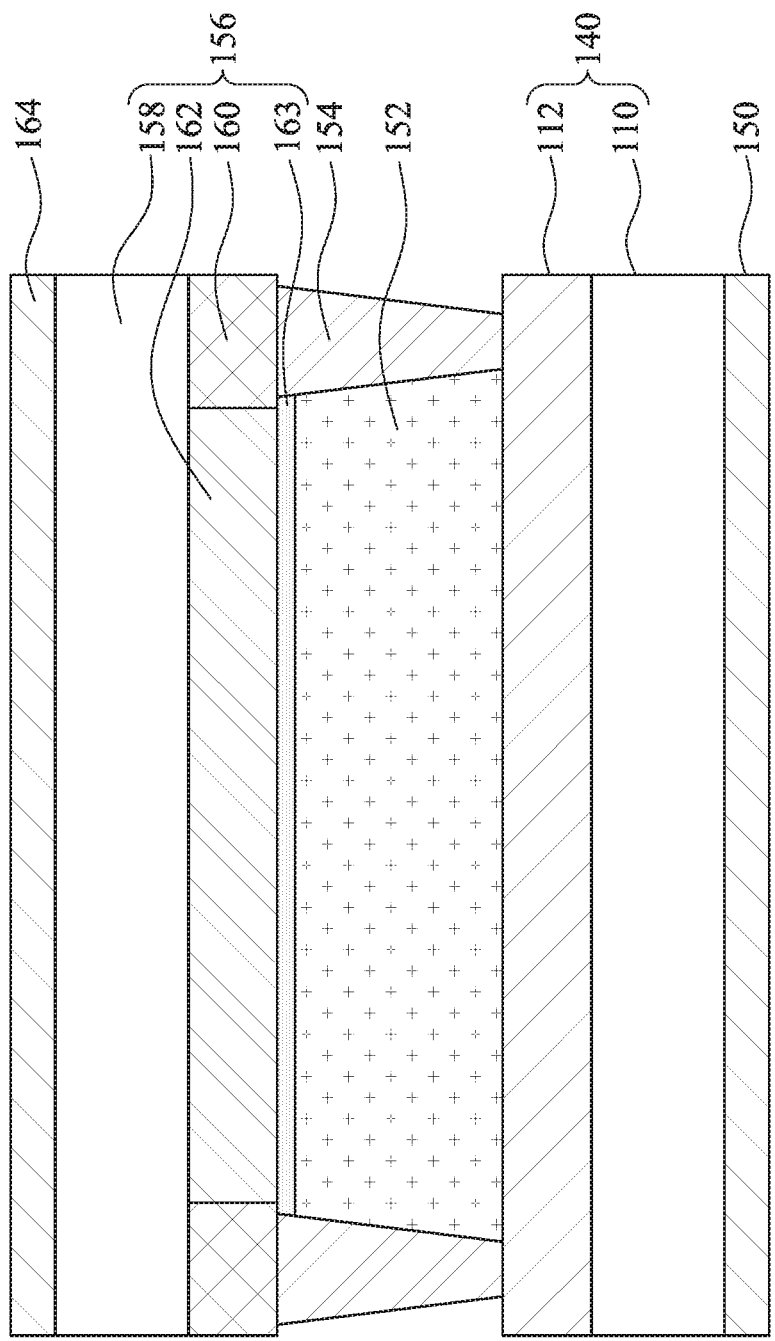
FIG. 1B is a side schematic view illustrating the original panel structure.

The original panel structure 100A can be applied to a liquid crystal type panel structure, as shown in FIG. 1B. FIG. 1B is a side schematic view illustrating the original panel structure 100A. Specifically, the original panel structure 100A may include a first polarizer 150, an array substrate 140, a display medium layer 152, spacers 154, a color filter layer substrate 156, and a second polarizer 164.

The array substrate 140 may include the aforementioned first substrate 110 and the pixel array 112 thereon, and the first polarizer 150 is disposed on the lower surface of the first substrate 110. The display medium layer 152 is disposed above the array substrate 140, wherein the display medium layer 152 may include a display medium (not shown), such as liquid crystal molecules.

The color filter layer substrate 156 is disposed above the display medium layer 152 and includes a second substrate 158, a light shielding layer 160, a color filter layer 162, and a common electrode 163, wherein the second substrate 158 may be a transparent substrate such as a glass substrate. The light shielding layer 160 and the color filter layer 162 may be formed on a lower surface of the second substrate 158. The light shielding layer 160 may be a black matrix. The color filter layer 162 may include a color resist layer such as a red color resist layer, a green color resist layer, a blue color resist layer, or a combination thereof. The common electrode 163 may be disposed between the display medium layer 152 and the color filter layer 162, and is configured for coupling an electric field with the pixel electrode of the array substrate 140.

The second polarizer 164 is disposed on the upper surface of the second substrate 158. The spacers 154 are disposed between the array substrate 140 and the color filter layer substrate 156 and serve as support.

The aforementioned original panel structure 100A may be referred to as "the completed original panel structure 100A", that is, it can perform the function of displaying the image, for example, the electrical signals may be input to the pixel array 112 of the array substrate 140 to control the display medium of the display medium layer 152, so that the original panel structure 100A displays the image.

Figure 2A:
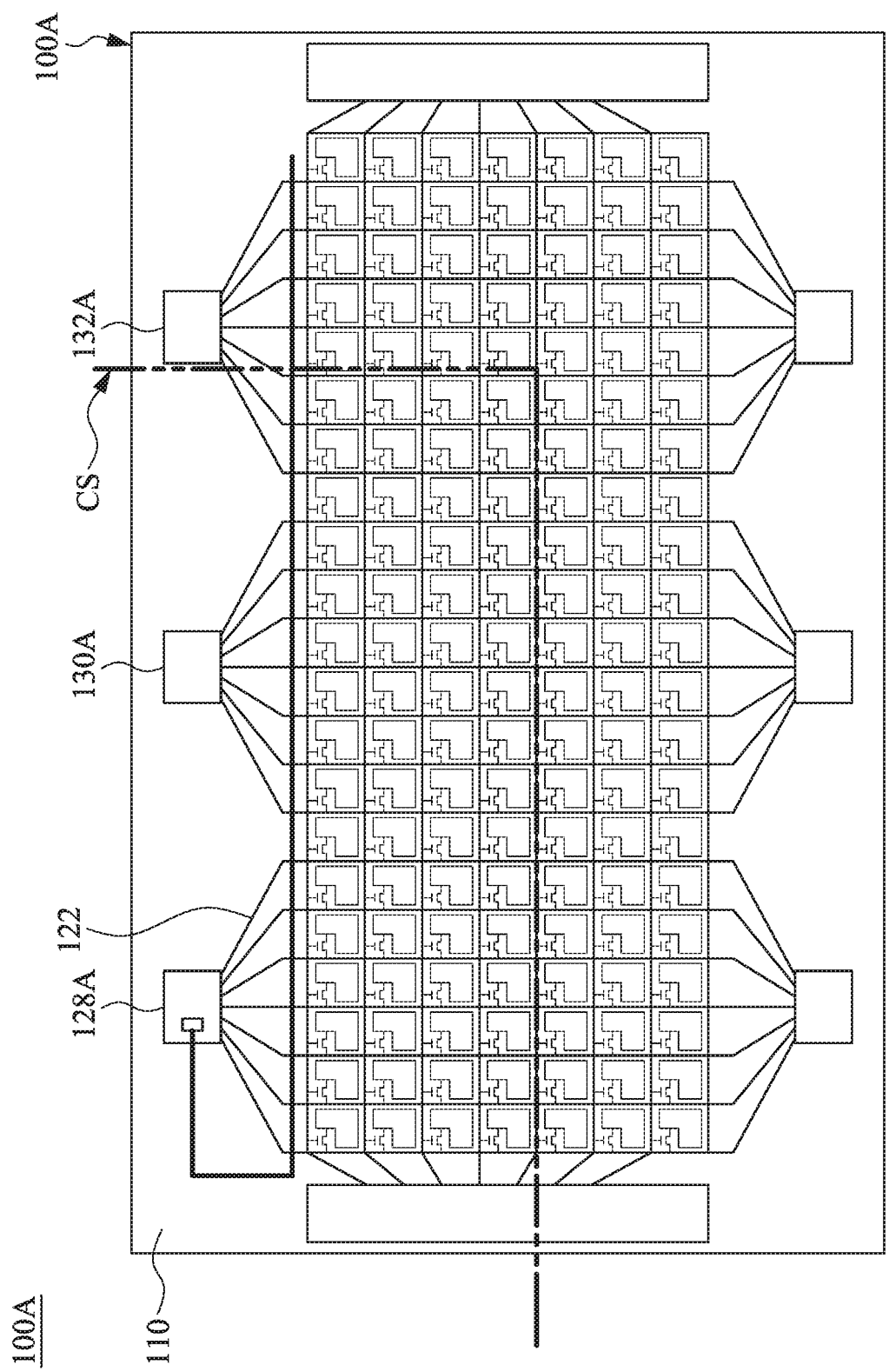
FIG. 2A and FIG. 2B are top schematic views illustrating that the original panel structure in FIG. 1A is processed.
Figure 2B:
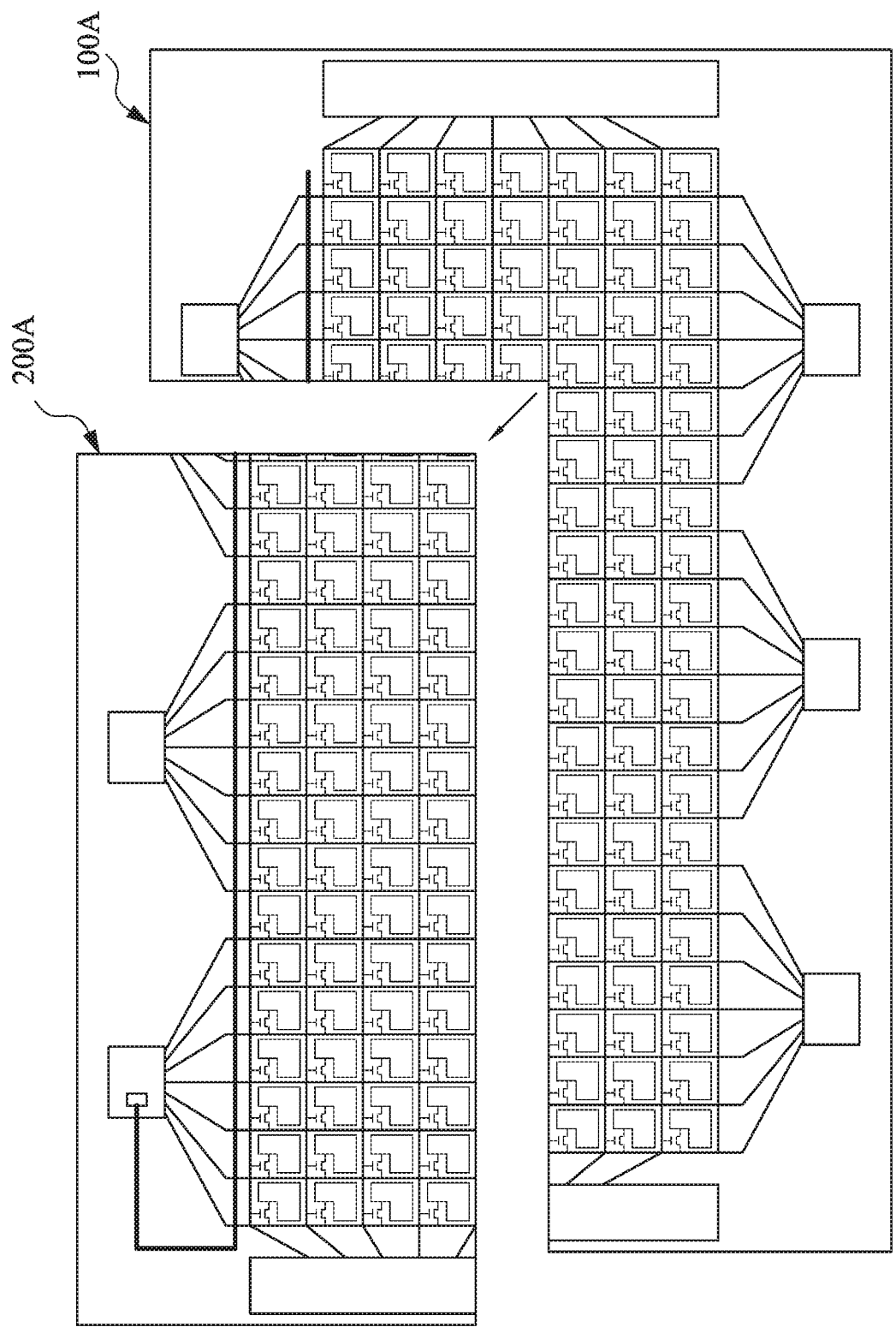

As described above, when facing with a requirement for new panel size, and this new panel size is required to be smaller than the size of the original panel structure 100A, it can directly process the completed original panel structure 100A to reduce the size of the original panel structure 100A so as to obtain the display panel that conforms to the requirement. For example, reference is made to FIG. 2A in conjunction with FIG. 2B. FIG. 2A and FIG. 2B are schematic top views illustrating that the original panel structure 100A in FIG. 1A is processed.

As shown in FIG. 2A, a cutting plane CS is defined on the original panel structure 100A according to the requirement for the new panel size first, wherein the area on the left and above the cutting plane CS is corresponding to the new panel size. Next, as shown in FIG. 2B, the original panel structure 100A can be cut along the cutting plane CS to obtain the panel structure that conforms to the panel size requirement. In order to facilitate the description, the panel structure conforming to the panel size requirement is referred to as the display panel 200A. After the cutting, the display panel 200A can be separated from the original panel structure 100A.

In some embodiments, the method of cutting includes using a cutter wheel, a diamond knife, a laser, or a combination thereof. Although the cutting plane CS is FIG. 2A is illustrated as an L-shape, the present disclosure is not limited thereto. In other embodiments, the cutting plane CS may also be a cross-shape. In addition, in some embodiments, during the cutting, a side sealant can be formed on the generated cross section, thereby preventing the display medium layer from flowing out. In this regard, cutting and forming the side sealant may be performed simultaneously to improve cutting reliability and yield.

Figure 3:
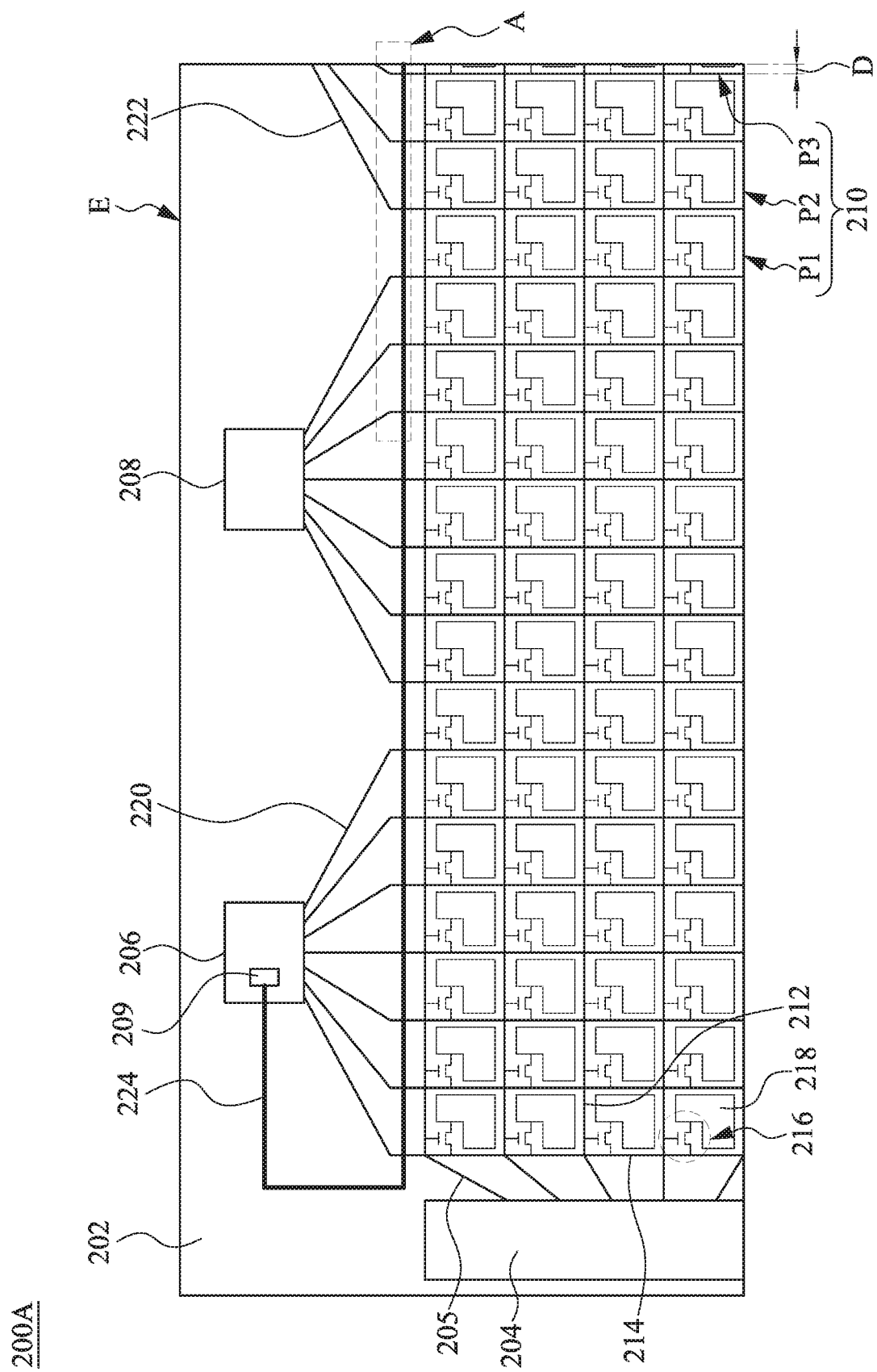
FIG. 3 is a top schematic view illustrating the display panel according to the first embodiment of the present disclosure.

Reference is made to FIG. 3. FIG. 3 is a schematic top view illustrating the display panel 200A according to the first embodiment of the present disclosure. In order to avoid confusion, although the display panel 200A in FIG. 3 has the same components as the original panel structure 100A in FIG. 1A, the components included in the display panel 200A use the different component symbols from those described aforementionedly.

As shown in FIG. 3, the display panel 200A includes a first substrate 202, a pixel array 210 disposed on the first substrate 202, a gate driving array circuit 204, and source driving components 206 and 208, first wirings 220, second wirings 222, and a conductive line 224.

The gate driving array circuit 204 can be configured to output the electrical signals, and the electrical signals can be transmitted to the scan lines 212 through the gate wirings 205 to conduct the corresponding thin film transistors 216. The source driving components 206 and 208 can be configured to output the electrical signals, and the electrical signals can be transmitted to the data lines 214 through the first wiring 220, so as to drive the pixel electrodes 218 through the corresponding thin film transistors 216 which are connected thereto.

Reference is made to FIG. 2A in conjunction with FIG. 3. During the cutting, the uncut wirings 122 in the original panel structure 100A are the first wiring 220 of the display panel 200A, and the cut wirings 122 in the original panel structure 100A are the second wiring 222 of the display panel 200A. Furthermore, the wirings 122 electrically connected to the source driving components 128A and 130A are separated from the cutting plane CS, and these wirings 122 become the first wiring 220 of the display panel 200A after the cutting; the wirings 122 electrically connected to the source driving components 132A overlap the cutting planes CS, and these wirings 122 become the second wirings 222 of the display panel 200A after cutting.

Figure 4A:
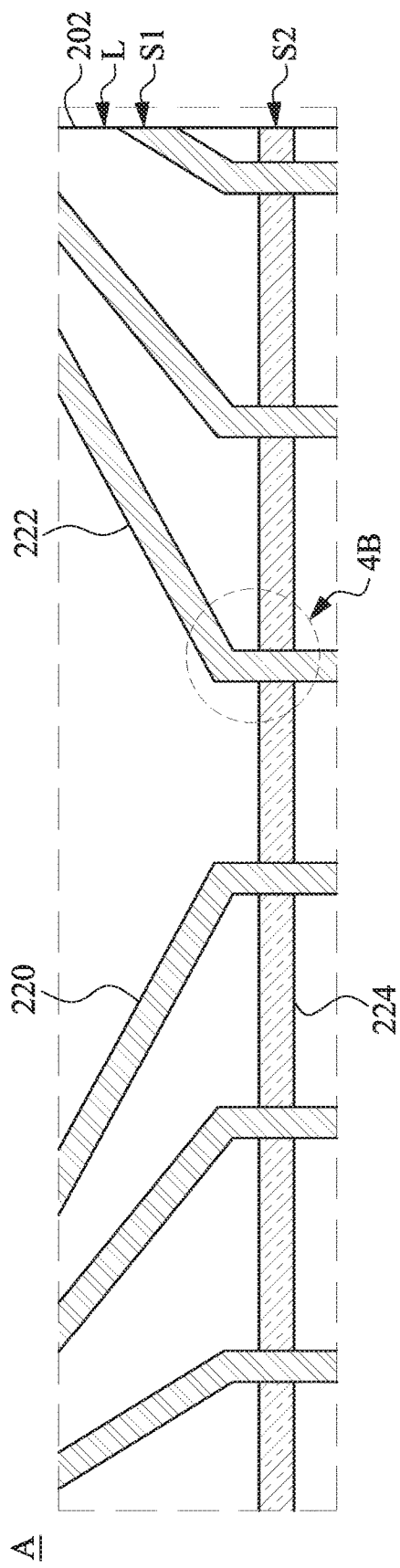
FIG. 4A is an enlarged schematic view of a region A in FIG. 3.

In this regard, since the first substrate 110 is cut in conjunction with the wirings 122 electrically connected to the source driving component 132A, the respective boundaries of the first substrate 202 and the second wirings 222 of the display panel 200A are aligned with each other after the cutting. For example, as shown in FIG. 4A, FIG. 4A is an enlarged schematic view of a region A in FIG. 3. Each of the second wirings 222 can have an end surface S1, and the end surfaces S1 of the different second wirings 222 are aligned with the same edge line L of the first substrate 202.

Reference is made back to FIG. 3. Corresponding to the result of the cutting, the pixels of the pixel array 210 can be divided into first pixels P1, second pixels P2, and third pixels P3, wherein the second pixel P2 is located between the first pixel P1 and the third pixel P3.

The first wirings 220 can be electrically connected to the source driving components 206 and 208, and can also be electrically connected to the first pixels P1 through the data lines 214, respectively. In other words, after the cutting, the first pixels P1 of the pixel array 210 can still receive the electrical signals outputted from the source driving components 206 and 208, and thus the pixel electrodes 218 thereof can be driven through the first wirings 220 so as to display the image. The second wirings 222 can be electrically connected to the second pixels P2, respectively. Since the second wirings 222 at this time are not electrically connected to any of the source driving components due to the cutting, the second pixels P2 of the pixel array 210 at this time fail to drive the pixel electrodes 218 thereof by the electrical signals. As a result, the image cannot be normally displayed.

In this regard, the minimum vertical distance from the first pixels P1, which can display the image normally, to the edge E of the first substrate 202 (the edge E is formed of four sides of the first substrate 202, i.e., the edge E of the first substrate 202 includes the left side, the right side, the upper side, and the lower side of the first substrate 202) may be greater than the minimum vertical distance from the second pixels P2, which fail to display the image normally, to the edge E of the first substrate 202. For example, the minimum vertical distance from the first pixel P1 to the left side of the first substrate 202 may be greater than the minimum vertical distance from the second pixel P2 to the right side of the first substrate 202. Therefore, if the display panel 200A is applied to display the image at this time, a portion of the pixel array 210 near the edge is unable to display the image. In some embodiments, the area formed of all first pixels P1 will be larger than the area formed of all second pixels P2, so that the pixel array 210 still can provide the display image with sufficient area.

Moreover, the third pixels P3 are the pixels which are destroyed by the cutting due to that their structures are overlapped with the cutting plane (i.e., the cutting plane CS in FIG. 2A). Since the structures of the third pixels P3 are destroyed during the cutting, the area of each of the third pixels P3 is smaller than the area of each of the first pixels P1 and the area of each of the second pixels P2.

Furthermore, the area of each of the third pixels P3 varies according to the position of the cutting plane. When the position of the cutting plane causes most of the structure of the third pixel P3 to be damaged, the third pixel P3 has smaller area; when the position of the cutting plane causes a small portion of the structure of the third pixel P3 to be damaged, the third pixel P3 has a larger area.

Therefore, for the second pixel P2, the minimum vertical distance from it to the edge E of the first substrate 202 (e.g., the right side of the first substrate 202) is related to the area of the third pixel P3. Corresponding to the size of the area that the third pixel P3 may form, the minimum vertical distance D between the second pixel P2 of the last row in the pixel array 210 and the edge E of the first substrate 202 (e.g., the right side of the first substrate 202) can be substantially greater than 0 micron and less than or equal to 150 microns.

The conductive line 224 still extends to partially overlap the first wirings 220 and the second wirings 222 and is electrically connected to the same-color signal driving circuit 209 in the source driving component 206. In this regard, since the conductive line 224 is electrically connected to the same-color signal driving circuit 209 by one end of the conductive line 224 which is relatively far away from the second pixel P2 and the source driving component 206, in which the same-color signal driving circuit 209 disposed, is also one of the source driving components 206 and 208 which is the farthest from the second pixel P2, the electrical connection between the conductive line 224 and the same-color signal driving circuit 209 can be prevented from being cut due to the cutting process. In addition, during the cutting, a portion of the conductive line 224 is also cut off, so that the edge line L of the first substrate 202 and the end surface S2 of the conductive line 224 are also aligned with each other, as shown in FIG. 4A.

Since the conductive line 224 is formed before the cutting process, the conductive line 224 can be electrically connected to the second wirings 222 by the welding process, thereby controlling the image displayed by the second pixels P2. The further description is provided below.

Figure 4C:
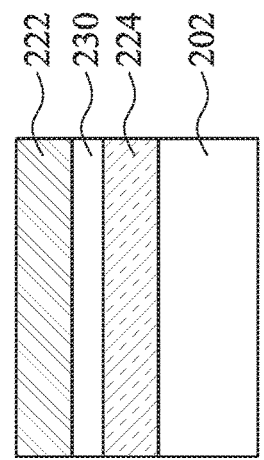
FIG. 4C is a cross-sectional schematic view along the line segment I-I' in FIG. 4B.
Figure 4B:
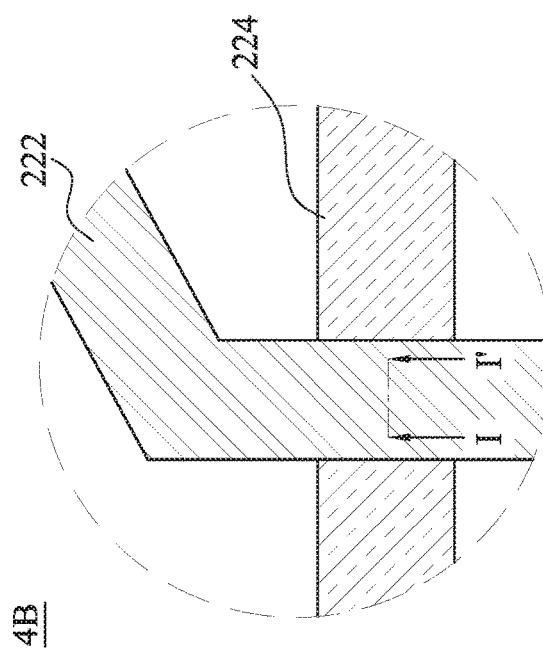
FIG. 4B is an enlarged schematic view of a region 4B in FIG. 4A.

Reference is made to FIG. 4A in conjunction with FIG. 4B and FIG. 4C. FIG. 4B is an enlarged schematic view of a region 4B in FIG. 4A, and FIG. 4C is a schematic cross-sectional view along the line segment I-I' in FIG. 4B. Before performing the welding process, the conductive line 224 and the second wirings 222 which are located above the first substrate 202 are completely separated by the insulation layer 230 so that they are electrically insulated, wherein the insulation layer 230 may be the gate insulation layer in the pixel array (i.e., the pixel array 210 in FIG. 3). In addition, the conductive line 224 and the first wirings 220 which are located above the first substrate 202 can also be completely separated by the insulation layer 230 so that they are electrically insulated.

Figure 5A:
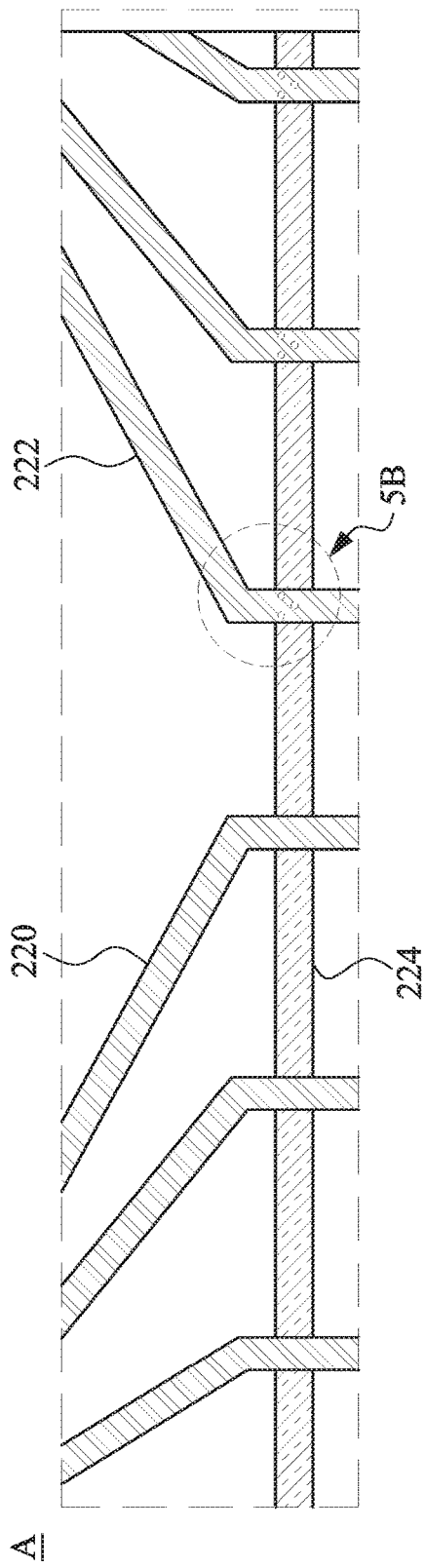
FIG. 5A is an enlarged schematic view of the region A of the display panel in FIG. 3 after performing the welding process.
Figure 5C:
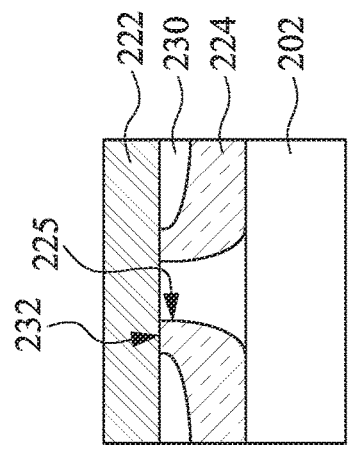
FIG. 5C is a cross-sectional schematic view along the segment II-II' in FIG. 5B.
Figure 5B:
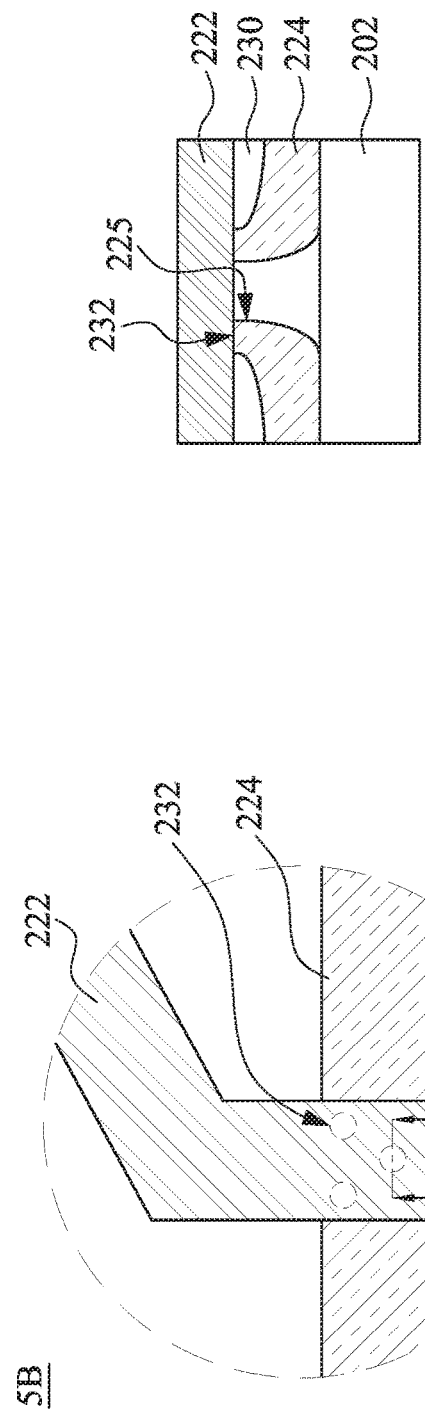
FIG. 5B is an enlarged schematic view of the region 5B in FIG. 5A.

Reference is made to FIG. 5A in conjunction with FIG. 5B and FIG. 5C. FIG. 5A is an enlarged schematic view of the region A of the display panel 200A in FIG. 3 after performing the welding process. FIG. 5B is an enlarged schematic view of the region 5B in FIG. 5A. FIG. 5C is a schematic cross-sectional view along the segment II-II' in FIG. 5B.

By the welding process, the conductive line 224 and the second wirings 222 can be welded together. The preformed welding process may be laser welding, for example, a laser may be emitted from the lower side of the first substrate 202 toward the conductive line 224 such that the conductive line 224 may pass through a portion of the insulation layer 230 and be welded to the second wiring 222. Specifically, after the welding process, the conductive line 224 has protrusions 225, each of the protrusions 225 can protrude toward the second wiring 222 and are in contact with and connected to the second wiring 222, and the insulation layer located between the conductive line 224 and the second wiring 222 can surround the protrusions 225. Accordingly, through the formed protrusions 225, the conductive line 224 can contact the second wiring 222 and form junctions 232. In this regard, in a single overlapping region between the conductive line 224 and the second wiring 222, there may be a plurality of junctions 232 so as to enhance the reliability of the electrical connection between the conductive line 224 to the second wiring 222. In other embodiments, the welding process may also be gas welding, electric resistance welding, electric arc welding, or induction welding.

Moreover, the line width of the conductive line 224 may be greater than the line width of each of the first wirings 220 and the second wirings 222. Such a size design can make the conductive line 224 have higher visibility, thereby improving the reliability of the welding process and yield. On the other hand, after the welding process, the conductive line 224 and the first wirings 220 which are located above the first substrate 202 can still be completely separated by the insulation layer 230 to achieve electrical insulation.

Reference is made to FIG. 3 in conjunction with FIG. 5A. By welding the conductive line 224 and the second wirings 222 together, the conductive line 224 can be electrically connected to the second wirings 222 such that they are configured to be equipotential. In other words, when the same-color signal driving circuit 209 outputs the electrical signal, the electrical signal can be transmitted to the source of the thin film transistor 216 of the second pixel P2 through the conductive line 224, the second wiring 222, and the data line 214, thereby driving the corresponding pixel electrode 218.

Specifically, the same-color signal driving circuit 209 can output the same-color signal, and the conductive line 224 can be used to provide the same-color signal to the second pixels P2, so that all second pixels P2 will display the image with same color. In this regard, according to the display mode of the display panel 200A being a normally black or a normal white mode, the same-color signal driving circuit 209 can output the same-color signal having the corresponding voltage level to the second pixels P2.

When the display mode of the display panel 200A is the normal black mode, the voltage level of the same-color signal outputted from the same-color signal driving circuit 209 may be the same as the voltage level of the common electrode, wherein the common electrode is, for example, the common electrode 163 located on the color filter layer substrate in FIG. 1B. In some embodiments, the voltage level of the same-color signal and the voltage level of the common electrode located on the color filter substrate may both be substantially 7 volts. As a result, since the voltage level of the same-color signal and the voltage level of the common electrode are close to each other, the electric field coupled therebetween is insufficient to change the alignment direction of the display medium layer (e.g., the display medium layer 152 in FIG. 1B). Therefore, the light beam passing through the display medium layer is unable to pass through the second polarizer (e.g., the second polarizer 164 in FIG. 1B) thereafter, so that the second pixels P2 can display the black picture.

When the display mode of the display panel 200A is the normal white mode, the voltage level of the same-color signal outputted from the same-color signal driving circuit 209 may be different from the voltage level of the common electrode. In some embodiments, the voltage level of the same-color signal may be substantially 8 volts, and the voltage level of the common electrode located on the color filter layer substrate may be substantially 4 volts. As a result, the electric field coupled by the pixel electrode 218 and the common electrode is sufficient to adjust the alignment direction of the display medium layer. Therefore, the light beam passing through the display medium layer can pass through the second polarizer thereafter, such that the second pixels P2 can display the white picture.

With the aforementioned configuration, it can control all second pixels P2 to present the black picture or the white picture, thereby preventing the display quality of the display panel 200A from being destroyed due to the inability to control the second pixels P2. Furthermore, since the second pixels P2 are located in a portion region of the pixel array 210 near the edge, even if this portion region is controlled to present the black picture or white picture, it does not affect the display panel 200A to output the picture by the first pixels P1. Moreover, since the second pixel P2 is located in a portion region of the pixel array 210 near the edge, after the outer frame (not shown) of the display panel 200A is assembled, the second pixels P2 and the outer frame present a visual effect of integration, thereby reducing the presence of the second pixels P2 and preventing the display quality of the display panel 200A from being destroyed by the second pixels P2.

Figure 6A:
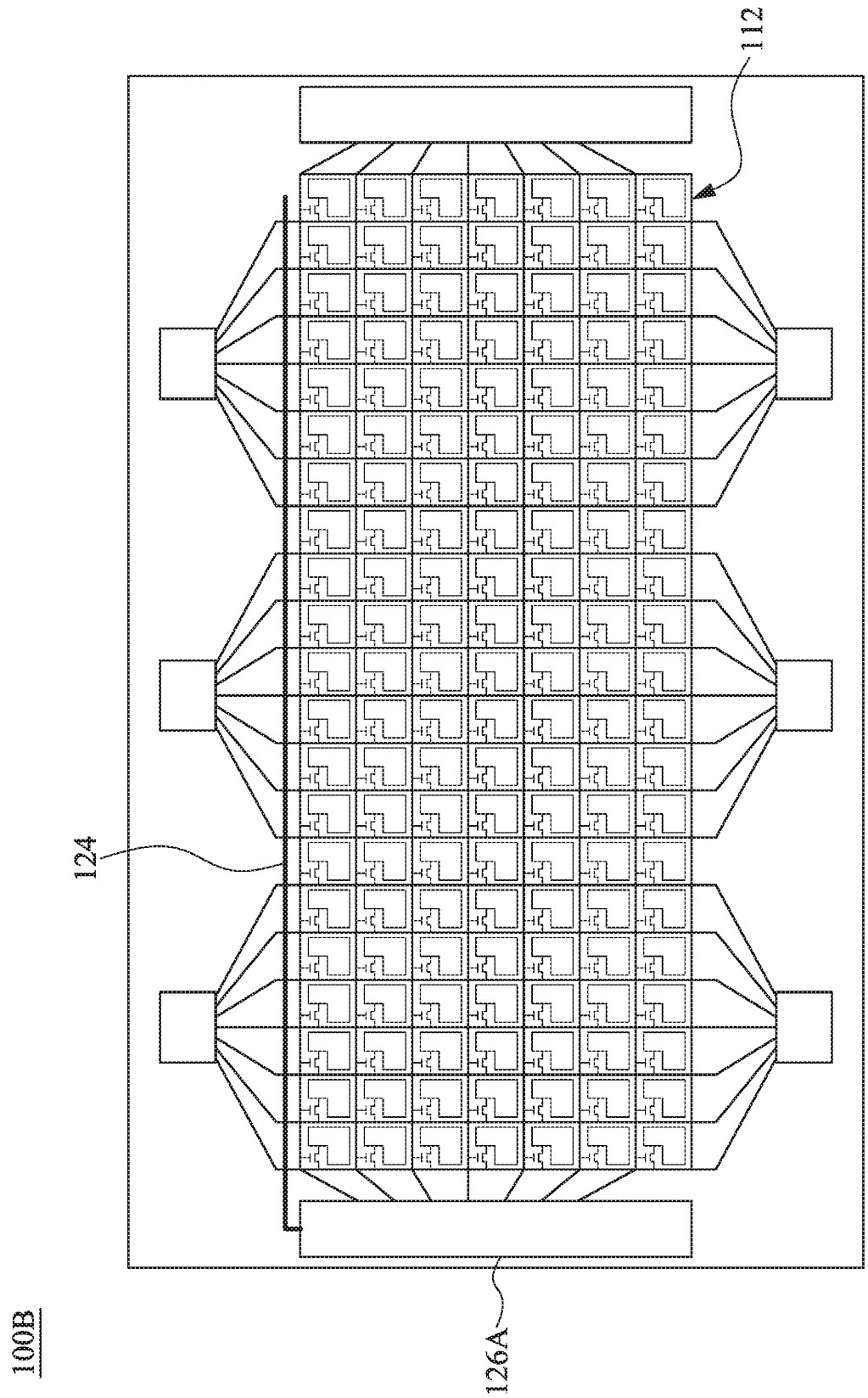
FIG. 6A is a top schematic view illustrating an original panel structure 100B according to a second embodiment of the present disclosure.

Reference is made to FIG. 6A. FIG. 6A is a top schematic view illustrating an original panel structure 100B according to a second embodiment of the present disclosure. At least one difference between the present embodiment and the first embodiment is that one end of the conductive line 124 of the original panel structure 100B in the present embodiment extends to the gate driving array circuit 126A and is electrically connected to the gate driving array circuit 126A. Since the gate driving array circuit 126A is disposed on one side of the pixel array 112, the electrical connection between the conductive line 124 and the gate driving array circuit 126A is not cut off when the original panel structure 100B is cut and the cutting plane (e.g., the cutting plane CS in FIG. 2A) overlaps the pixel array 112. Therefore, after cutting the original panel structure 100B and obtaining the display panel, it still can make the pixels, which are unable to be controlled, to display the picture with the same color through the conductive line 124.

Figure 6B:
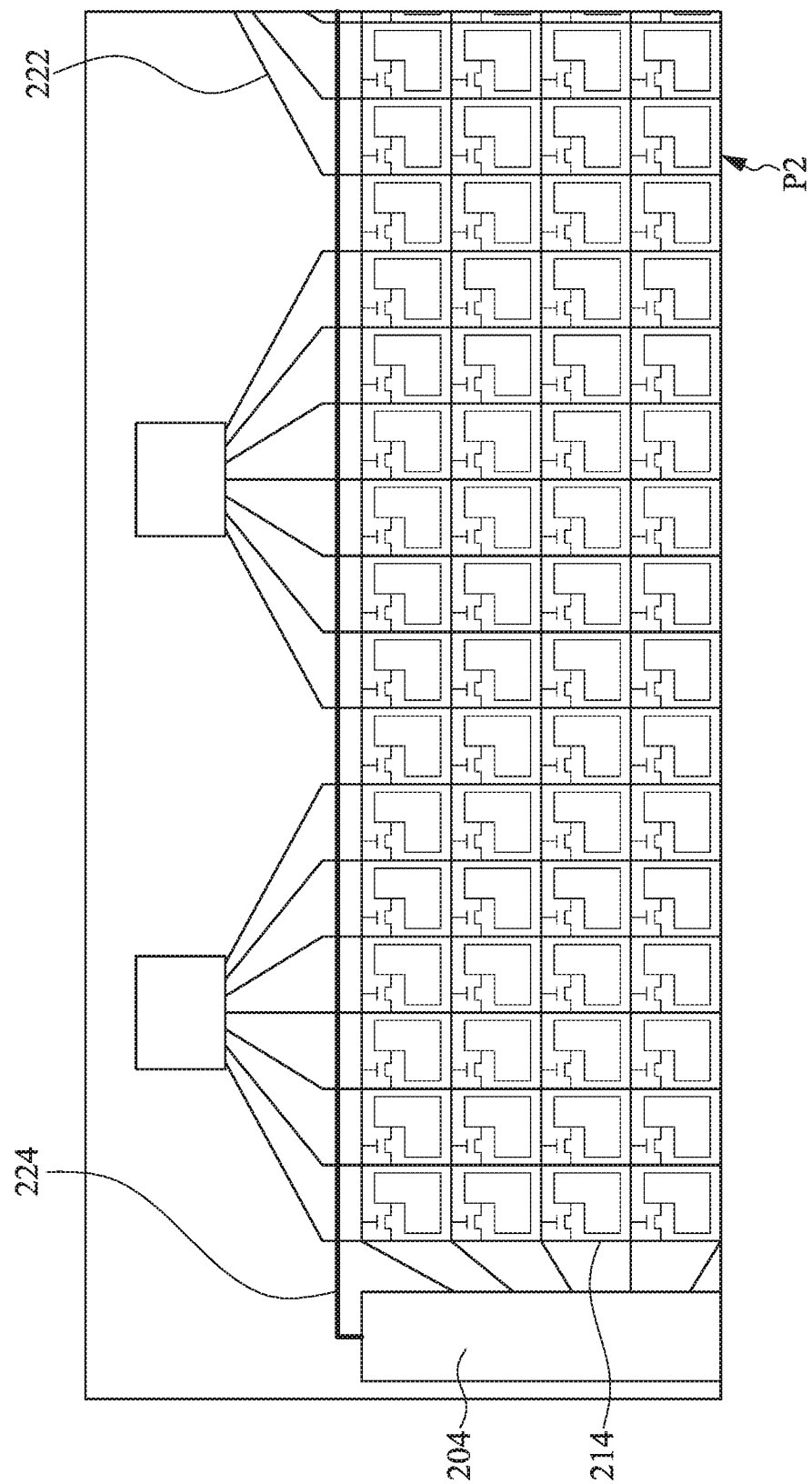
FIG. 6B is a top schematic view illustrating a display panel according to a second embodiment of the present disclosure.

Furthermore, reference is made to FIG. 6B. FIG. 6B is a top schematic view illustrating a display panel 200B according to a second embodiment of the present disclosure. In the present embodiment, after the conductive line 224 is welded to the second wirings 222, the same-color signal can be outputted by the gate driving array circuit 204, so that the conductive line 224 can be used to provide the same-color signal to the second wirings 222, and then the same-color signal is transmitted to the second pixels P2 through the second wirings 222 and the data lines 214, thereby controlling the second pixels P2 to present the picture with the same color.

Although the aforementioned embodiment is described with cutting an original panel structure which has been manufactured, the cutting process described in the present disclosure is not limited to this stage. In other words, the cutting process can also be performed at other stages. For example, in some embodiments, the original panel structure can be cut at the stage of that the display medium layer has not been filled between the array substrate and the color filter layer substrate, and then the display media layer is filled therebetween after the cutting. In some embodiments, the cutting can be performed at a stage of that the original panel structure is still on the mother board to obtain a panel structure conforming to the panel size requirement. In other words, with the configuration in which the conductive line has been formed, even if the cutting is performed at different stages, the welding process can be subsequently performed to electrically connect the conductive line to the second wirings.

In summary, the original panel structure may include the wirings and the conductive line, the wirings may be electrically connected to the thin film transistor for the pixel through the data lines, and the conductive line can overlap the wirings. When facing the requirement for the panel size which is smaller than the size of the existing panel structure, it can cut the manufactured original panel structure to obtain the display panel that conforms to the size requirements. If the situation of that the wirings are cut due to the cutting is occurred, the conductive line can be welded to the cut wirings by performing the welding process, so that the conductive line can be used to provide the same-color signal to these wirings, thereby controlling the pixels connected to these wirings display the same color. As a result, it can prevent the display quality of the display panel from being destroyed by these pixels.

While various embodiments of the present disclosure have been described above, it should be understood that they have been presented by way of example only, and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A method for manufacturing a display panel, comprising:
   cutting an original panel structure along a cutting plane to obtain a display panel, wherein the display panel comprises:
   a pixel array comprising a plurality of first pixels and a plurality of second pixels;
   a plurality of second wirings electrically connected to the second pixels, respectively; and
   a conductive line, having one end of the conductive line electrically connected to a same-color signal driving circuit of a first source driving component module, being extended to partially overlap the second wirings and electrically connected to the second wirings, wherein the conductive line is electrically connected to the second wirings thereby controlling images displayed by the second pixels, the cutting plane is separated from a plurality of first wirings of the display panel and is overlapped with a substrate and the second wirings of the display panel, during the cutting, a portion of the conductive line is also cut off, such that an edge line of the substrate is aligned with an end surface of each of the second wirings and an end surface of the conductive line; and
   welding a conductive line to the second wirings.

2. The method for manufacturing the display panel of claim 1, further comprising:
   before cutting the original panel structure, forming the conductive line, and the conductive line being extended to overlap the first wirings and the second wirings; and
   before cutting the original panel structure, forming an insulation layer to electrically insulate the conductive line from the first wirings and the second wirings.

3. The method for manufacturing the display panel of claim 1, wherein the display panel further comprises:
   a plurality of third wirings electrically connected to a second source driving component module and overlapping the cutting plane, and the third wirings become the second wirings of the display panel after cutting; and
   a plurality of data lines electrically connected to the first pixels.

4. The method for manufacturing the display panel of claim 1, wherein the display panel further comprises:
   a plurality of data lines electrically connected to the first pixels, wherein the second wirings and the data lines are not electrically connected to a signal source, and the conductive line is configured to provide a same-color signal to the second pixels through the second wirings, so that all of the second pixels show a same color and thus display a black picture.

5. The method for manufacturing the display panel of claim 1, wherein the display panel further comprises:
   a substrate, wherein the first pixels and the second pixels are disposed on the substrate, and the minimum distance from the first pixels to an edge of the substrate is greater than the minimum distance from the second pixels to the edge of the substrate, at least some of the second pixels are located between the first pixels and the edge of the substrate, and each of the second wirings is electrically connected to corresponding column of the second pixels without any broken; and
   a plurality of data lines electrically connected to the first pixels, wherein the second wirings and the data lines are not electrically connected to same signal source.

* * * * *